US012804810B2

(12) United States Patent
Pineda et al.

(10) Patent No.: US 12,804,810 B2
(45) Date of Patent: Nov. 17, 2026

(54) PPTC SMALL PLANAR SMD TEMPERATURE SENSORS AND OVERCURRENT DEVICES

(71) Applicant: Littelfuse, Inc., Chicago, IL (US)

(72) Inventors: Martin G. Pineda, Fremont, CA (US); Marco Doms, Chicago, IL (US); Sergio Fuentes Godinez, Newark, CA (US); Arjuna Shenoy, San Jose, CA (US); Oluwaseun K. Oyewole, Fremont, CA (US)

(73) Assignee: Littelfuse, Inc., Rosemont, IL (US)

( * ) Notice: Subject to any disclaimer, the term of this patent is extended or adjusted under 35 U.S.C. 154(b) by 242 days.

(21) Appl. No.: 18/668,345

(22) Filed: May 20, 2024

(65) Prior Publication Data

US 2024/0397618 A1 Nov. 28, 2024

Related U.S. Application Data

(60) Provisional application No. 63/468,308, filed on May 23, 2023.

(51) Int. Cl.

| | |
|---|---|
| ***H05K 1/18*** | (2026.01) |
| ***H05K 1/11*** | (2006.01) |
| ***H05K 1/181*** | (2026.01) |
| ***H05K 3/40*** | (2006.01) |
| *G01K 7/22* | (2006.01) |

(52) U.S. Cl.

CPC .............. *H05K 1/111* (2013.01); *H05K 1/115* (2013.01); *H05K 1/181* (2013.01); *H05K 3/4007* (2013.01); *G01K 7/226* (2013.01); *H05K 2201/10287* (2013.01)

(58) Field of Classification Search

CPC ........ H05K 1/111; H05K 1/115; H05K 1/181; H05K 3/4007; H05K 2201/10287; G01K 7/226

USPC .......................................................... 361/760

See application file for complete search history.

(56) References Cited

U.S. PATENT DOCUMENTS

| | | | | |
|---|---|---|---|---|
| 7,166,496 | B1 | 1/2007 | Lopez | |
| 2005/0173414 | A1 | 8/2005 | Ishii | |
| 2007/0145362 | A1* | 6/2007 | Wolkin | G01K 17/006 438/689 |
| 2019/0027796 | A1* | 1/2019 | Matus | H01M 10/637 |
| 2020/0020467 | A1* | 1/2020 | Rentrop | H01C 1/01 |

FOREIGN PATENT DOCUMENTS

| | | | |
|---|---|---|---|
| CN | 114143956 | A | 3/2022 |
| CN | 115985600 | A | 4/2023 |
| JP | H08222405 | A | 8/1996 |

(Continued)

OTHER PUBLICATIONS

Extended European Search Report for EP Application No. 24173032.4, dated Jan. 24, 2025, 9 pages.

*Primary Examiner* — Binh B Tran

(74) *Attorney, Agent, or Firm* — KDW Firm PLLC

(57) ABSTRACT

A device assembly for surface mount devices includes a matrix of SMD skeletons and a polymeric positive temperature coefficient (PPTC) material disposed over the matrix. The matrix consists of multiple rows, with each SMD skeleton having a pair of terminals and multiple whiskers perpendicular to and between the terminals. The PPTC material connects the terminals to the whiskers.

10 Claims, 11 Drawing Sheets

(56) References Cited

FOREIGN PATENT DOCUMENTS

| | | | |
|---|---|---|---|
| JP | H09246013 | A | 9/1997 |
| JP | 2000124003 | A | 4/2000 |
| JP | 2006216476 | A | 8/2006 |
| JP | 2008041298 | A | 2/2008 |
| KR | 1020190010484 | A | 1/2019 |
| TW | 341722 | B | 10/1998 |
| TW | 202043406 | A | 12/2020 |
| TW | 202044951 | A | 12/2020 |

* cited by examiner

PPTC SMALL PLANAR SMD TEMPERATURE SENSORS AND OVERCURRENT DEVICES

CROSS-REFERENCE TO RELATED APPLICATION

The present application claims the benefit of priority under 35 U.S.C. § 119 to U.S. Provisional Application Ser. No. 63/468,308, filed May 23, 2023, entitled "PPTC SMALL PLANAR SMD TEMPERATURE SENSORS & OVERCURRENT DEVICES," the disclosure of which is incorporated herein by reference in its entirety.

FIELD OF THE DISCLOSURE

Embodiments of the present disclosure relate to PPTC small planar surface mount devices and their manufacturing issues.

BACKGROUND

Polymer positive temperature coefficient (PPTC) devices may be used as overcurrent or over-temperature protection device, as well as current or temperature sensors, among various applications. In overcurrent or over-temperature protection applications, the PPTC device may be considered a resettable fuse, designed to exhibit low resistance when operating under designed conditions, such as low current. The resistance of the PPTC device may be altered by direct heating due to temperature increase in the environment of the circuit protection element, or via resistive heating generated by electrical current passing through the circuit protection element.

For example, a PPTC device may include a polymer material and a conductive filler that provides a mixture that transitions from a low resistance state to a high resistance state, due to changes in the polymer material, such as a melting transition or a glass transition. At such a transition temperature, sometimes called a trip temperature, where the trip temperature may often range from room temperature or above, the polymer matrix may expand and disrupt the electrically conductive network, rendering the composite much less electrically conductive. This change in resistance imparts a fuse-like character to the PPTC materials, which resistance may be reversible when the PPTC material cools back to room temperature.

The behavior of PPTC devices may be tailored to satisfy various criteria, including robust performance, as well as operation temperature. For example, known fluoropolymer-based PPTC devices may provide reliable trip temperatures in the range of 160° C. or greater. This performance may not be suitable for all applications.

The PPTC material may be combined with electrical conductors and terminals to form a discrete surface mount device (SMD), where the SMD may operate as a temperature sensor or an overcurrent device. Particularly when involving small form factor manufacture, the disparate materials making up the PPTC SMD temperature sensors and overcurrent devices present challenges.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a device assembly for surface mount devices in accordance with the present disclosure may include a matrix and a polymeric positive temperature coefficient (PPTC) material disposed over the matrix. The matrix consists of multiple rows, each row having multiple surface mount device (SMD) skeletons, each skeleton having a pair of terminals and multiple whiskers perpendicular to and between the terminals. The PPTC material connects the terminals to the whiskers.

An exemplary embodiment of a method in accordance with the present disclosure may include stamping, affixing, and spin coating operations. A matrix of SMD skeletons is stamped from electrically conductive material. A backing is affixed to the matrix on a first side and a second matrix of landing pads is affixed to the second side, the second side being opposite the first side. A think film PPTC material is spin coated over the matrix to form a PPTC SMD device assembly.

DETAILED DESCRIPTION

A PPTC SMD assembly is disclosed in which an SMD skeleton matrix is placed on a backing material such as PCB or flexible tape. The SMD skeleton matrix consists of several SMD skeletons which consist of multiple whiskers (interdigitated fingers) disposed orthogonally between two terminals. The backside of the backing material has pairs of landing pads that are disposed opposite respective terminals, with each landing pad pair being associated with one of the SMD skeletons. No elements of the SMD skeletons touch one another. A PPTC material is applied to the SMD skeleton matrix, whether by spin coating, spraying, painting, or some other means. The PPTC material causes connections to be formed between the whiskers, the terminals, and the landing pads of each individual PPTC SMD. The PPTC-laden SMD skeleton matrix is etched or diced to retrieve individual PPTC SMDs.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1A:
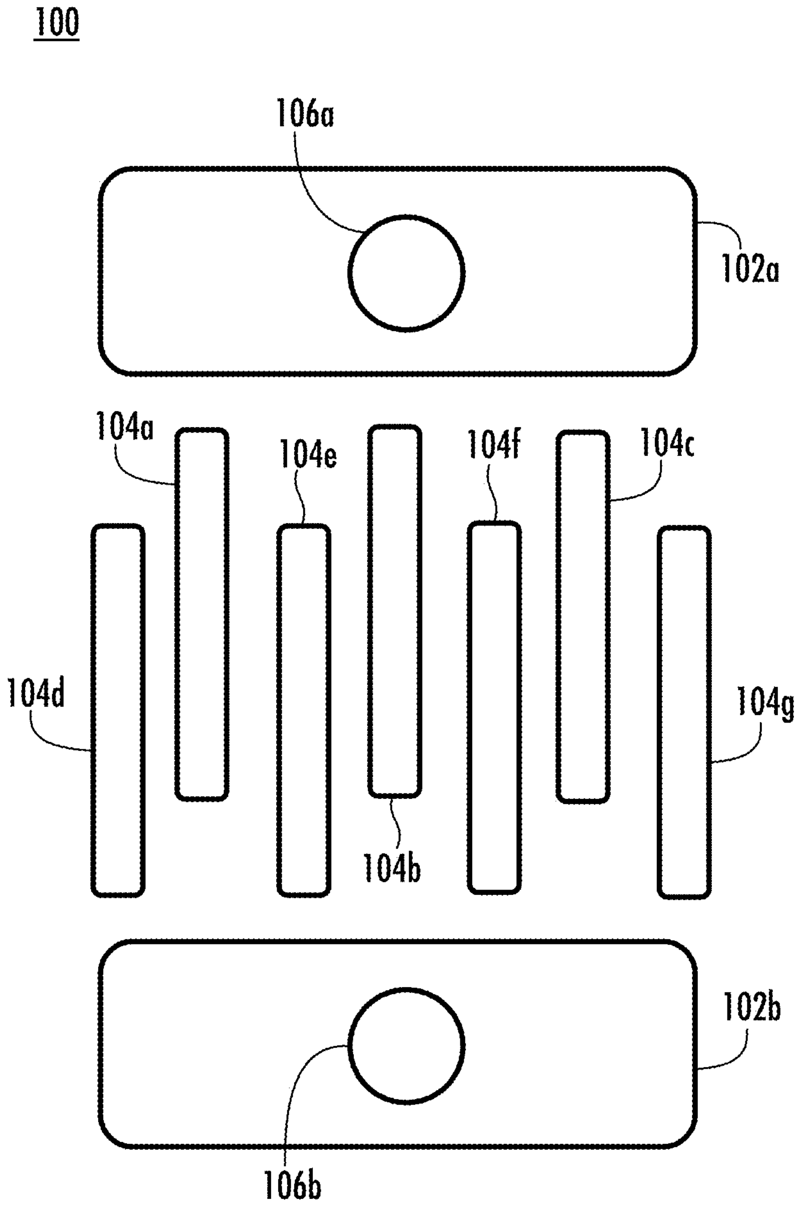
FIGS. 1A-1B are diagrams illustrating an SMD skeleton, in accordance with exemplary embodiments.
Figure 1B:
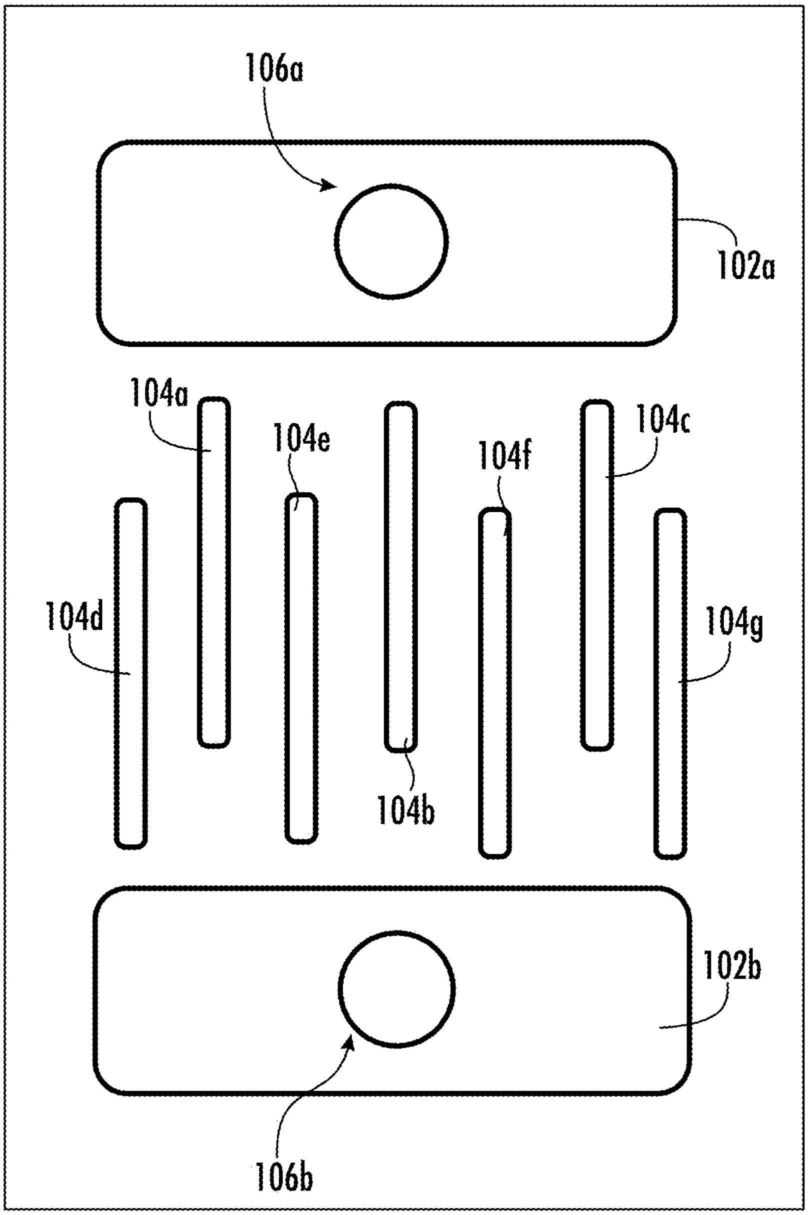

FIGS. 1A-1B are representative drawings of an SMD skeleton 100 for use in manufacturing a PPTC SMD assembly 400 (FIGS. 4A-4B), according to exemplary embodiments. FIG. 1A is an overhead view and FIG. 1B is a photographic view of the SMD skeleton 100. In exemplary embodiments, the SMD skeleton 100 consists of the electrically conductive components of a PPTC SMD, such as the PPTC SMD 500 (FIG. 5A).

The SMD skeleton 100 features a pair of terminals, terminal 102*a* disposed at one end, and terminal 102*b* disposed at the other, opposite end (collectively, "terminals 102"). The SMD skeleton 100 also features multiple whiskers, also known as interdigitated fingers, with whiskers 104*a*, 104*b*, and 104*c* being nearer terminal 102*a*, and whiskers 104*d*, 104*e*, 104*f*, and 104*g* being nearer terminal 102*b* (collectively, "whiskers 104").

The whiskers 104 are aligned orthogonal to the two terminals 102 and parallel to one another, with whisker 104*a* being adjacent and sandwiched between whiskers 104*d* and 104*e*, whisker 104*e* being adjacent and sandwiched between whiskers 104*a* and 104*b*, whisker 104*b* being adjacent and sandwiched between whiskers 104*e* and 104*f*, whisker 104*f* being adjacent and sandwiched between whisker 104*b* and 104*c*, and whisker 104*c* being adjacent and sandwiched between whiskers 104*f* and 104*g*, with whisker 104*d* being at one end and whisker 104*g* being at the other, opposite end. The number of whiskers 104 is not meant to be limiting, as the SMD skeleton 100 may have more or fewer whiskers 104, with the size of the terminals 102 being adjusted to approximate at their length the distance the whiskers are spaced apart.

The terminals 102 of the SMD skeleton 100 each have a via for coupling the terminals to pads on a surface, such as a printed circuit board (PCB), a flexible tape, or other material used to provide a backing to the SMD skeleton. Terminal 102*a* has via 106*a* and terminal 102*b* has via 106*b* (collectively, "vias 106"). In exemplary embodiments, both the terminals 102 and the whiskers 104 are made of an electrically conductive material, such as copper. None of the whiskers 104 touch one another, nor do any of the whiskers touch either terminal 102.

Figure 2A:
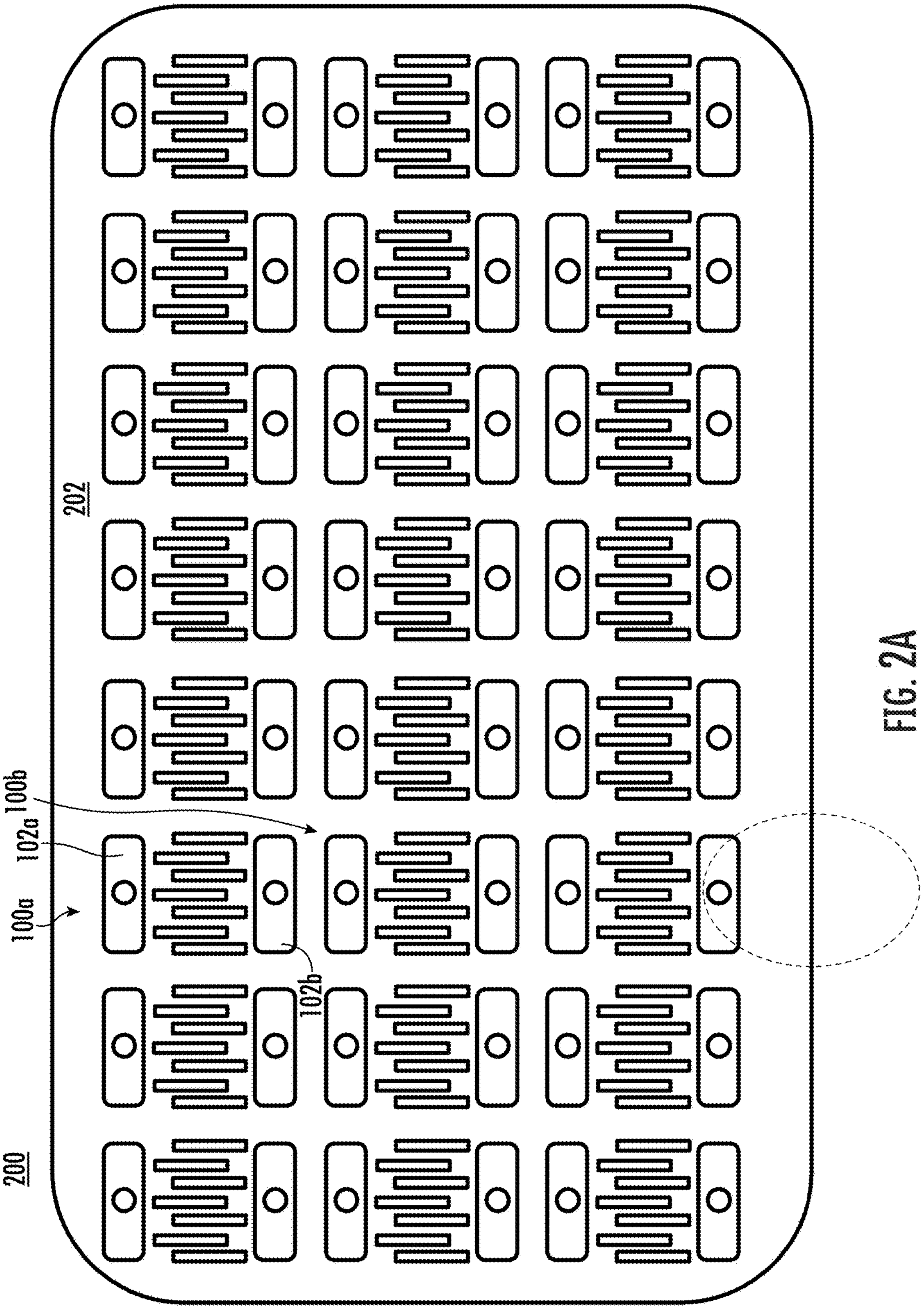
FIGS. 2A-2B are diagrams illustrating an SMD skeleton matrix, in accordance with exemplary embodiments.
Figure 2B:
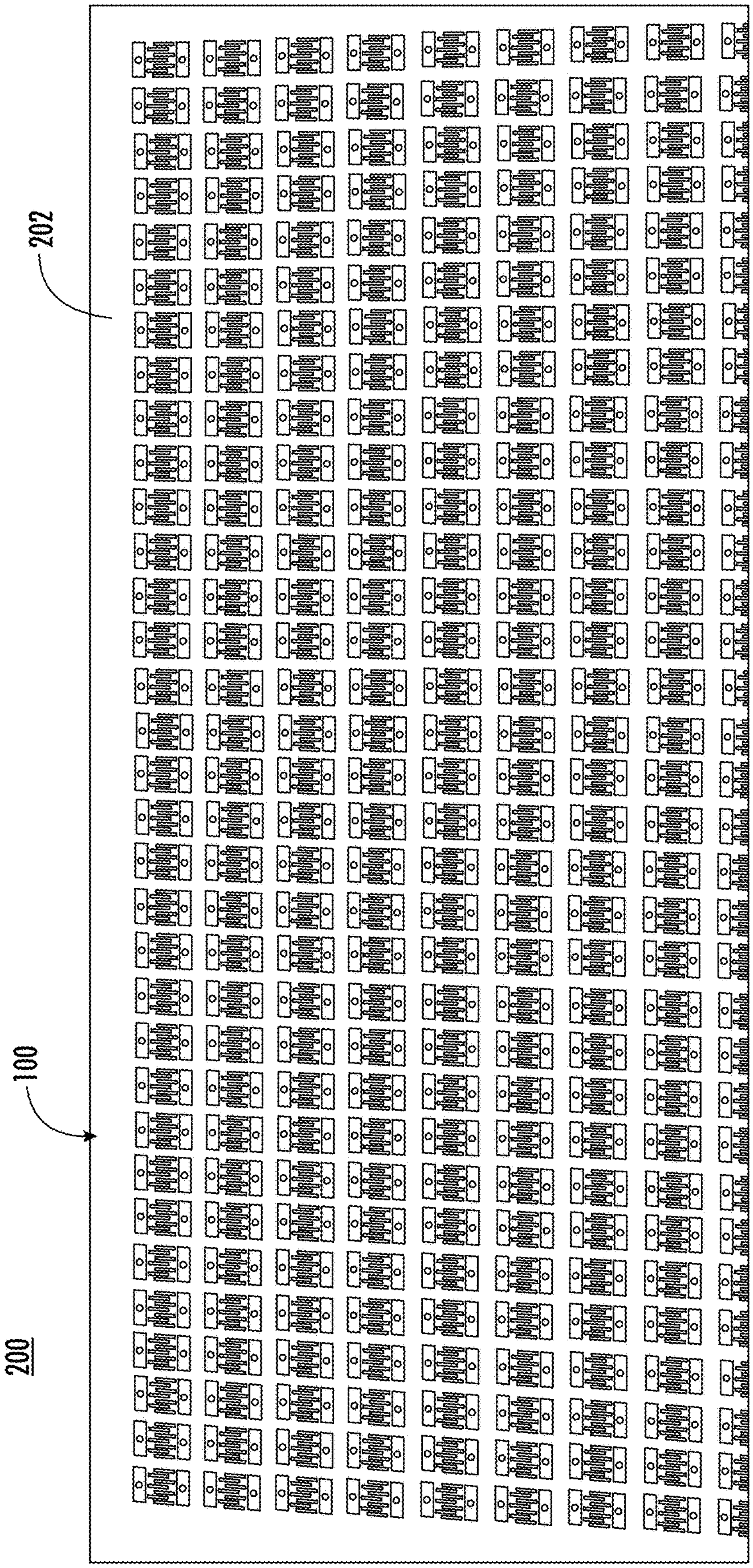

FIGS. 2A-2B are representative drawings of an SMD skeleton matrix for use in manufacturing the PPTC SMD assembly 400, according to exemplary embodiments. FIG. 2A is an overhead view and FIG. 2B is a photographic view of the SMD skeleton matrix 200. The SMD skeleton matrix 200 features multiple rows of SMD skeletons 100, spaced approximately equidistant one another along each row, with each row being approximately equidistant each other row. The SMD skeletons 100 are laid upon a backing material 202, such as a PCB composed of FR4 or other material, a flexible tape, a ceramic, a plastic, and so on.

Although the representative drawing (FIG. 2A) shows three rows of eight SMD skeletons 100, there may be many more or fewer, as the number of SMD skeletons 100 making up the SMD skeleton matrix 200 is not meant to be limiting. The partial photographic view shows a great many SMD skeletons 100 occupying the SMD skeleton matrix 200.

Figure 3A:
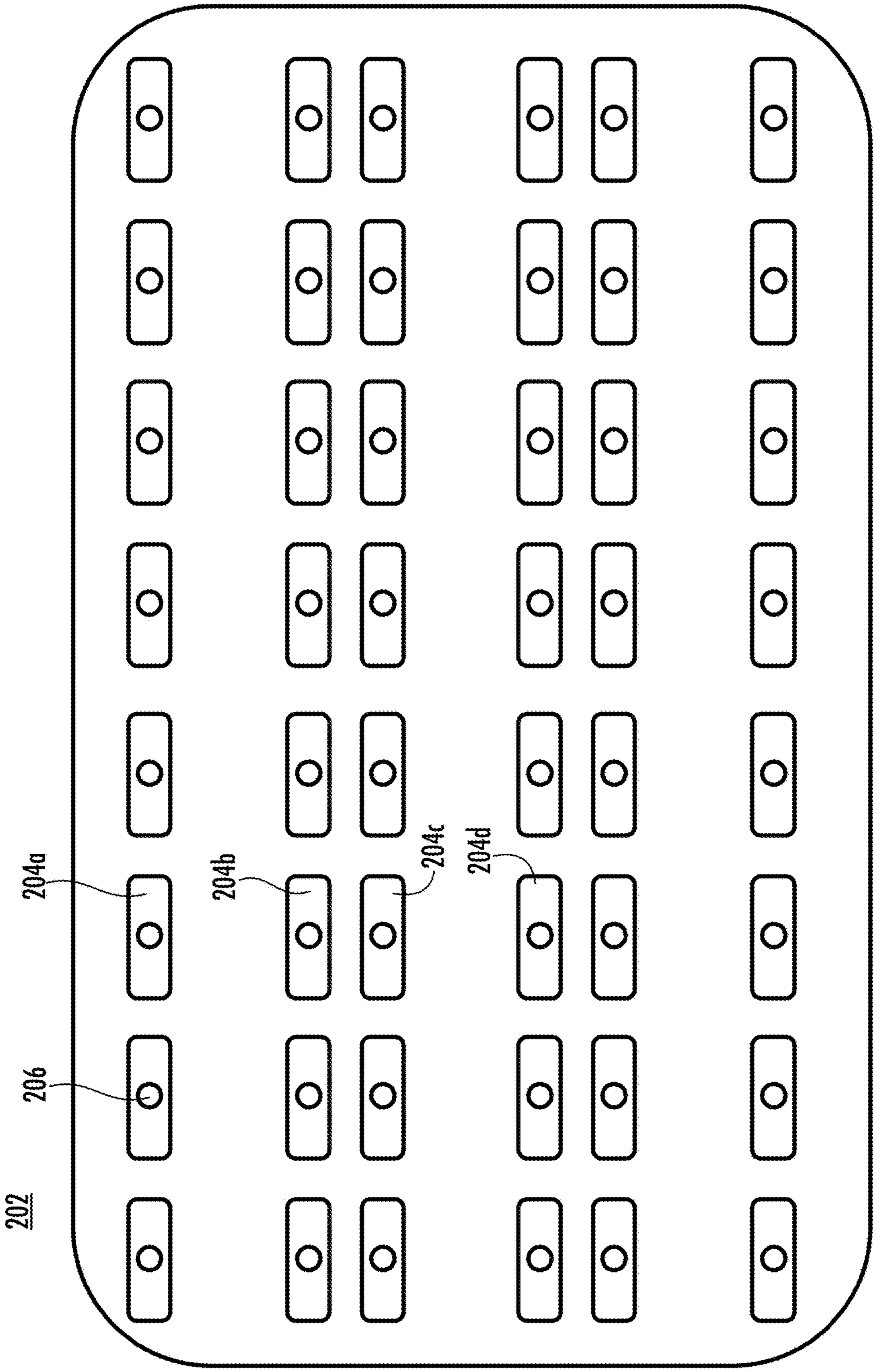
FIGS. 3A-3B are diagrams illustrating the backing material used with the SMD skeleton matrix of FIGS. 2A-2B, in accordance with exemplary embodiments.
Figure 3B:
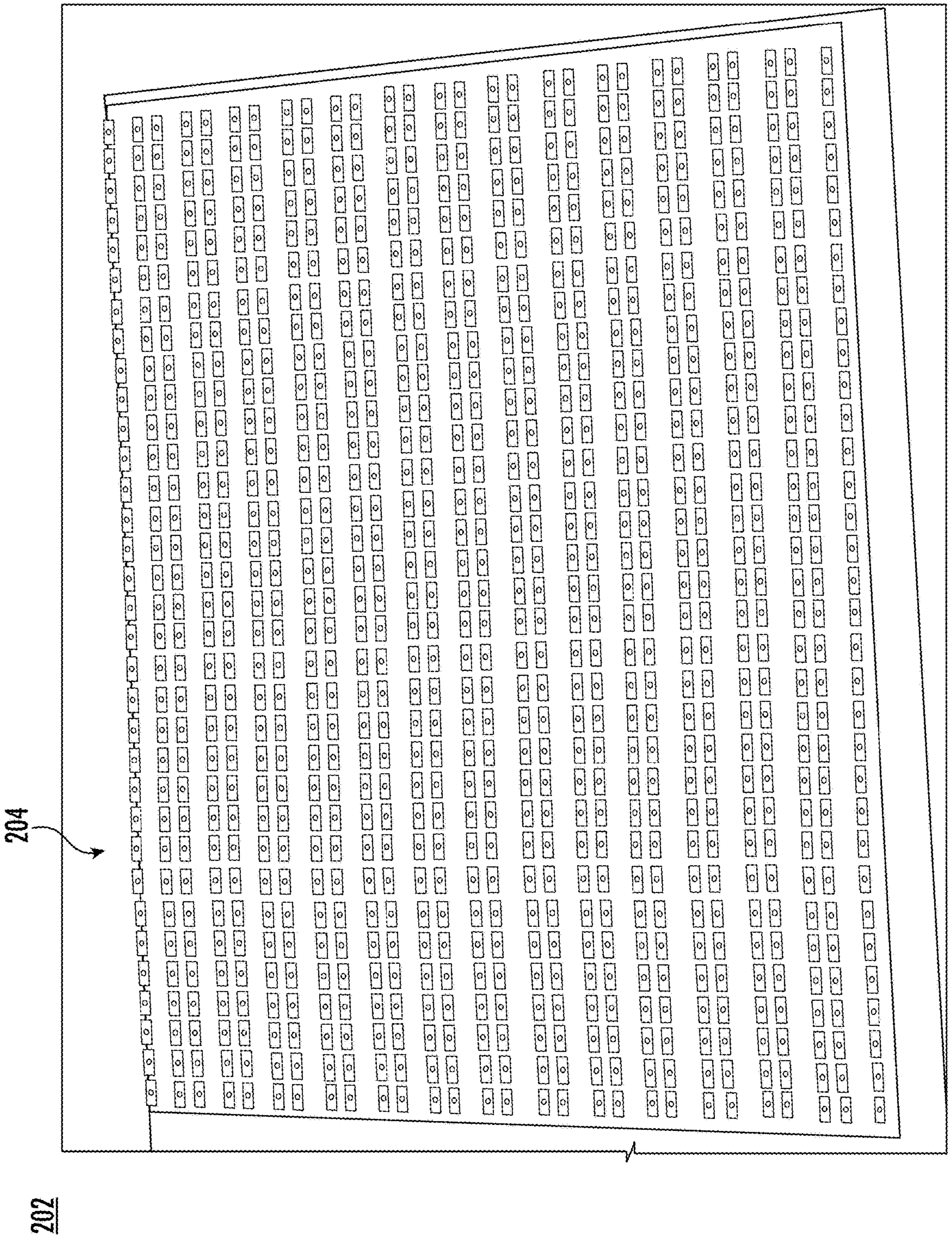

FIGS. 3A-3B are representative drawings of the backing material 202 used to support the SMD skeleton matrix 200 of FIGS. 2A and 2B, according to exemplary embodiments. FIG. 3A is an overhead backside view and FIG. 3B is a photographic backside view of the backing material 202. The backside of the backing material 202 features multiple rows of landing pad pairs, spaced approximately equidistant one another along each row, with each row being approximately equidistant each other row. Much like the front side of the backing material 102 features a matrix of SMD skeletons 100, the back side of the backing material features a matrix of landing pad pairs, with one landing pad pair being dedicated to each SMD skeleton.

Landing pad 204*a* is arranged on the opposite side of backing material 202 to terminal 102*a* (FIG. 2A) while landing pad 204*b* is arranged on the opposite side of backing material to terminal 102*b* (collectively, "landing pads 204"). Put another way, backing material 202 is sandwiched between landing pad 204*a* and terminal 102*a* and backing material 202 is sandwiched between landing pad 204*b* and terminal 102*b*. Further, in exemplary embodiments, the size of each landing pad 204 is substantially the same as the size of its respective terminal 102. The indicated landing pads 204 are thus meant to connect to SMD skeleton 100*a* indicated in FIG. 2A, while landing pads 204*c* and 204*d* are meant to connect to SMD skeleton 100*b*. Like the terminals 102, the landing pads 204 also each have vias 206. The landing pads 204 are soldered to dedicated pads on a circuit assembly for which the PPTC SMD (e.g., PPTC SMD 500 in FIG. 5A) is intended.

Figure 4A:
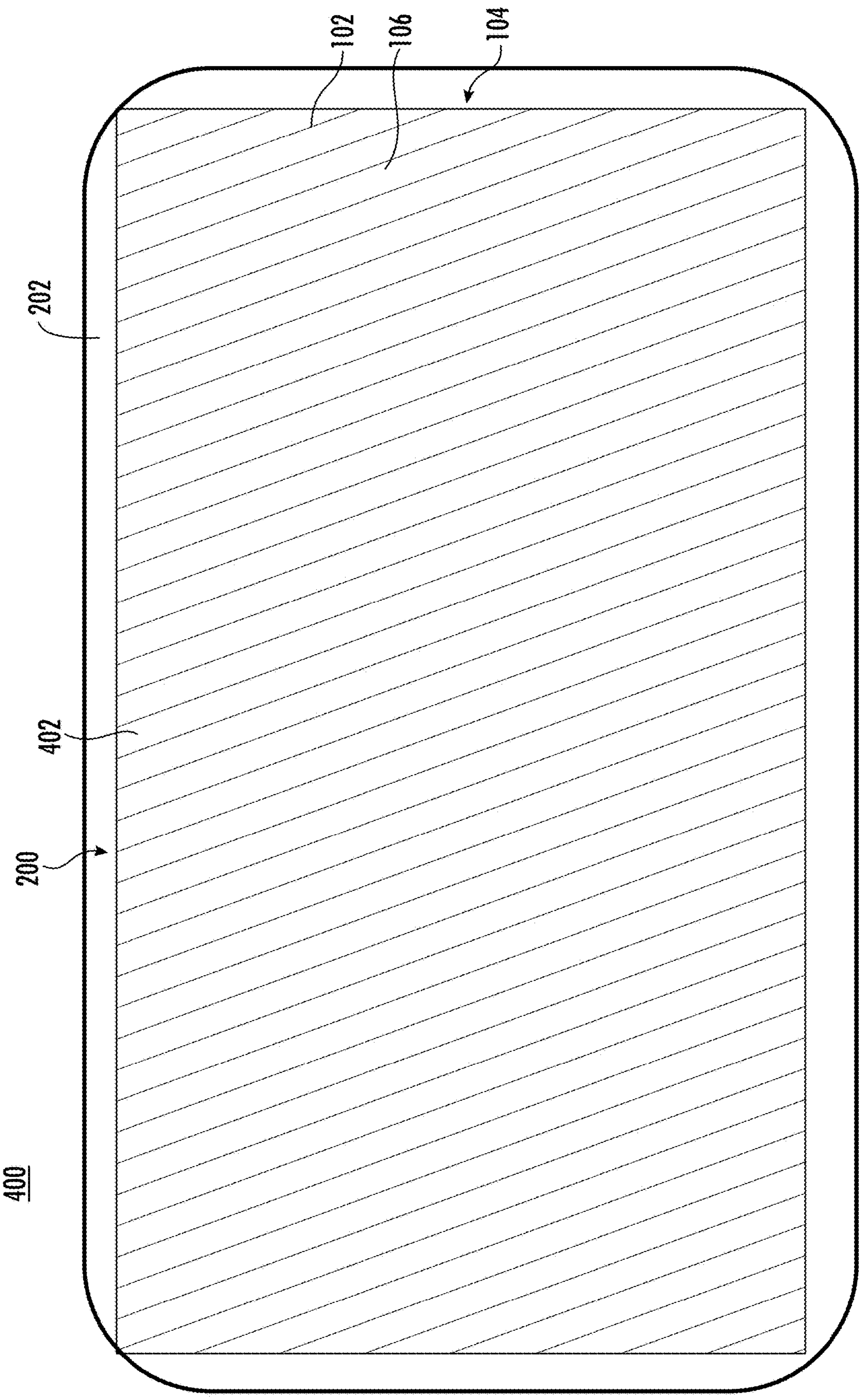
FIGS. 4A-4B are diagrams illustrating a PPTC SMD assembly, in accordance with exemplary embodiments.
Figure 4B:
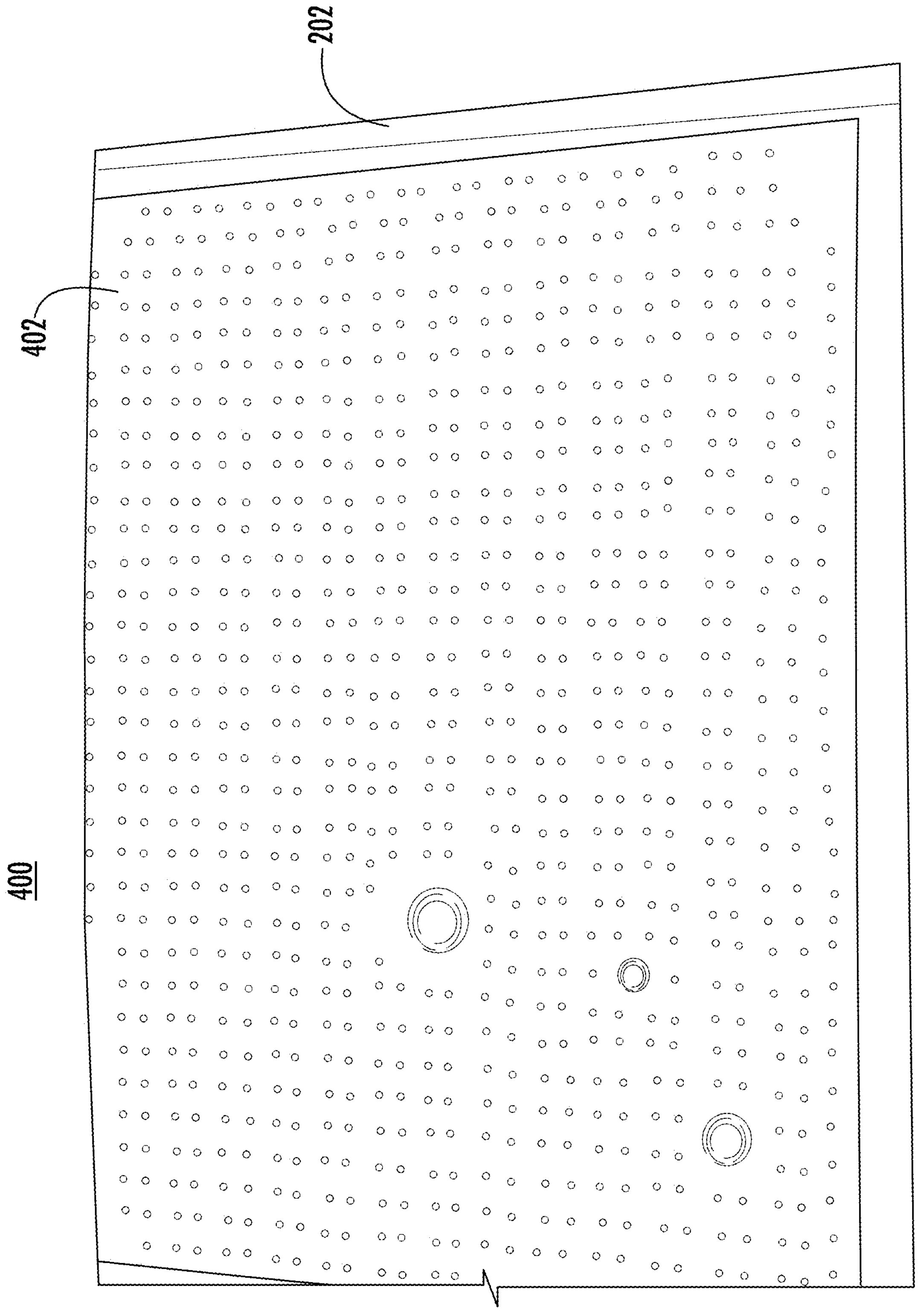
Figure 5A:
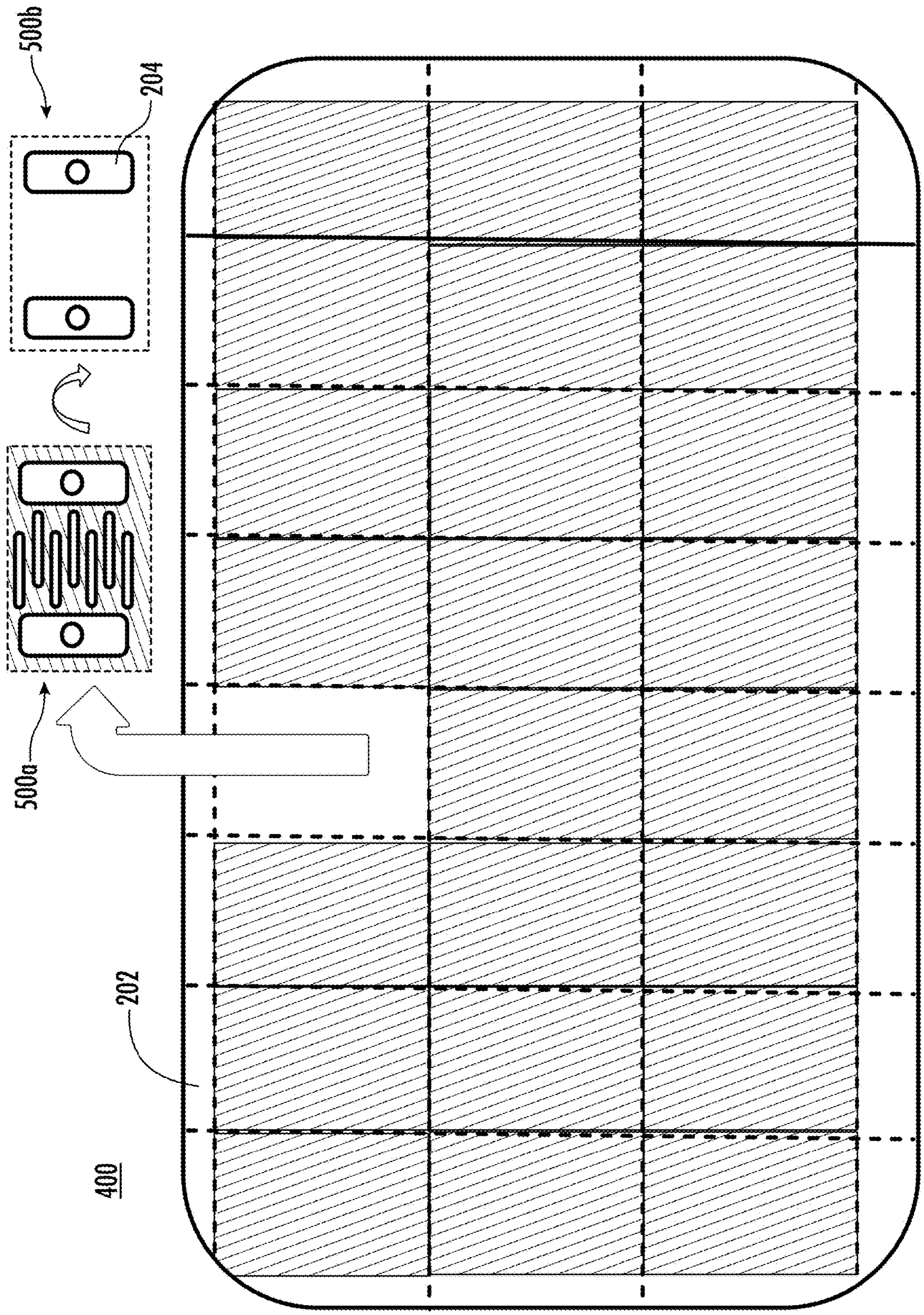
FIGS. 5A-5B are diagrams illustrating the PPTC SMD assembly of FIGS. 4A-4B, including an individual PPTC SMD, in accordance with exemplary embodiments.

FIGS. 4A-4B are representative drawings of a PPTC SMD assembly 400, according to exemplary embodiments. FIG. 4A is an overhead view and FIG. 4B is a photographic view of the PPTC SMD assembly 400. The PPTC SMD assembly 400 features the SMD matrix 200 (FIG. 2A) which provides the electrically conductive portion of each PPTC SMD. Additionally, the PPTC SMD assembly 400 features a thin film of PPTC material 402 which is deposited over the entire SMD matrix 200.

In exemplary embodiments, the PPTC material 402 is a thin film coating of PPTC ink material that is sprayed over the terminals 102 and whiskers 104. In exemplary embodiments, the PPTC material 402 is approximately 100 μm thick. The PPTC material 402 is applied using, e.g., spin coating, ink spraying, or jetting process as a way to apply the ink on top of the backing material 202, whether the backing material is a PCB, a flexible tape, a substrate, a wafer, etc. If the backing material 202 has etch structures, it should be easy to build a conductive film with a thickness of 100 μm thick as the PPTC material 402. In exemplary embodiments, the PPTC material 402 can be applied on flexible surfaces. Although the PPTC material 402 is shown as transparent, the photograph in FIG. 4B shows that, in some embodiments, the PPTC material 402 obscures the SMD skeleton matrix 200.

In exemplary embodiments, the PPTC material 402 causes connections to be made between the whiskers 104 and terminals 102 of each SMD skeleton 100 making up the SMD skeleton matrix 200. In exemplary embodiments, the connections are based on proximity of the whisker 104 to the terminal 102. So, looking at the SMD skeleton 100 (FIG. 1A), once the PPTC material is applied to the matrix, whiskers 104*a*, 104*b*, and 104*c* would be connected to terminal 102*a* while whiskers 104*d*, 104*e*, 104*f*, and 104*g* would be connected to terminal 102*b*. These connections inform how current travels between the terminals.

Further, in exemplary embodiments, the PPTC material 402 oozes through the vias 106 of each terminal, through respective landing pad vias 206 on respective landing pads 204 on the opposite side of the backing 202. Because the PPTC material 402 allows current to flow therethrough, this means that each SMD skeleton 100, through its terminals 102, is electrically coupled to respective landing pads 206 on the other side of the backing 202.

Figure 5B:
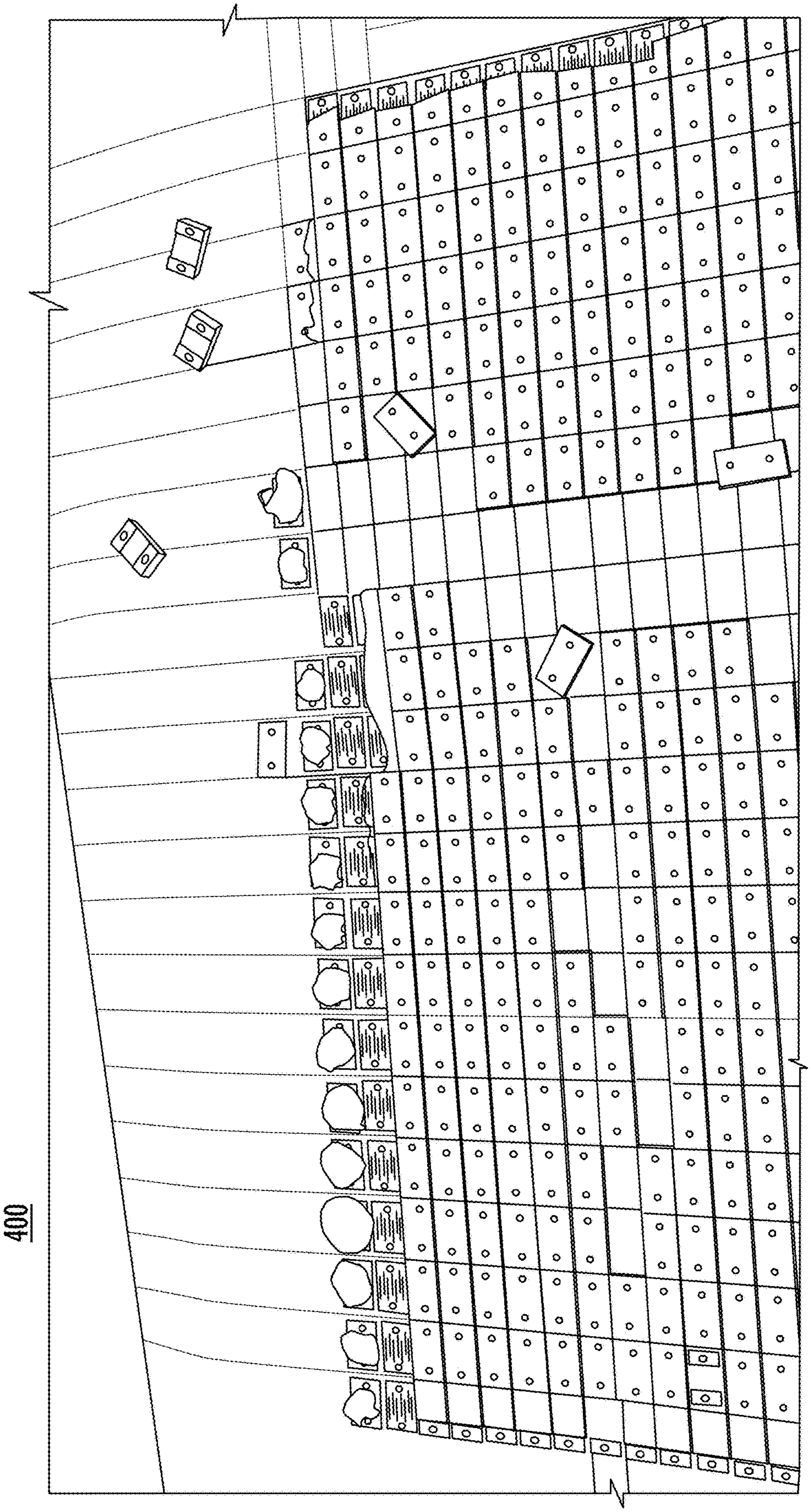

FIGS. 5A-5B are representative drawings of the PPTC SMD assembly 400 and an individual PPTC SMD 500 retrieved from the assembly, according to exemplary embodiments. FIG. 5A is an overhead view and FIG. 5B is a photographic view of the PPTC SMD assembly 400 and PPTC SMD 500. Both a top view 500*a* and a bottom view 500*b* of the PPTS SMD is shown (collectively, "PPTC SMD 500"). Etch or dice marks are made over the PPTC SMD assembly 400, such that the individual components may be retrieved. The SMD skeleton 100 is visible on the PPTC SMD 500*a* while the landing pads 204 are visible on the PPTC SMD 500*b*. In the photographic image (FIG. 5B), several individual PPTC SMDs 500 are separated from the other devices of the PPTC SMD assembly 400.

Figure 6:
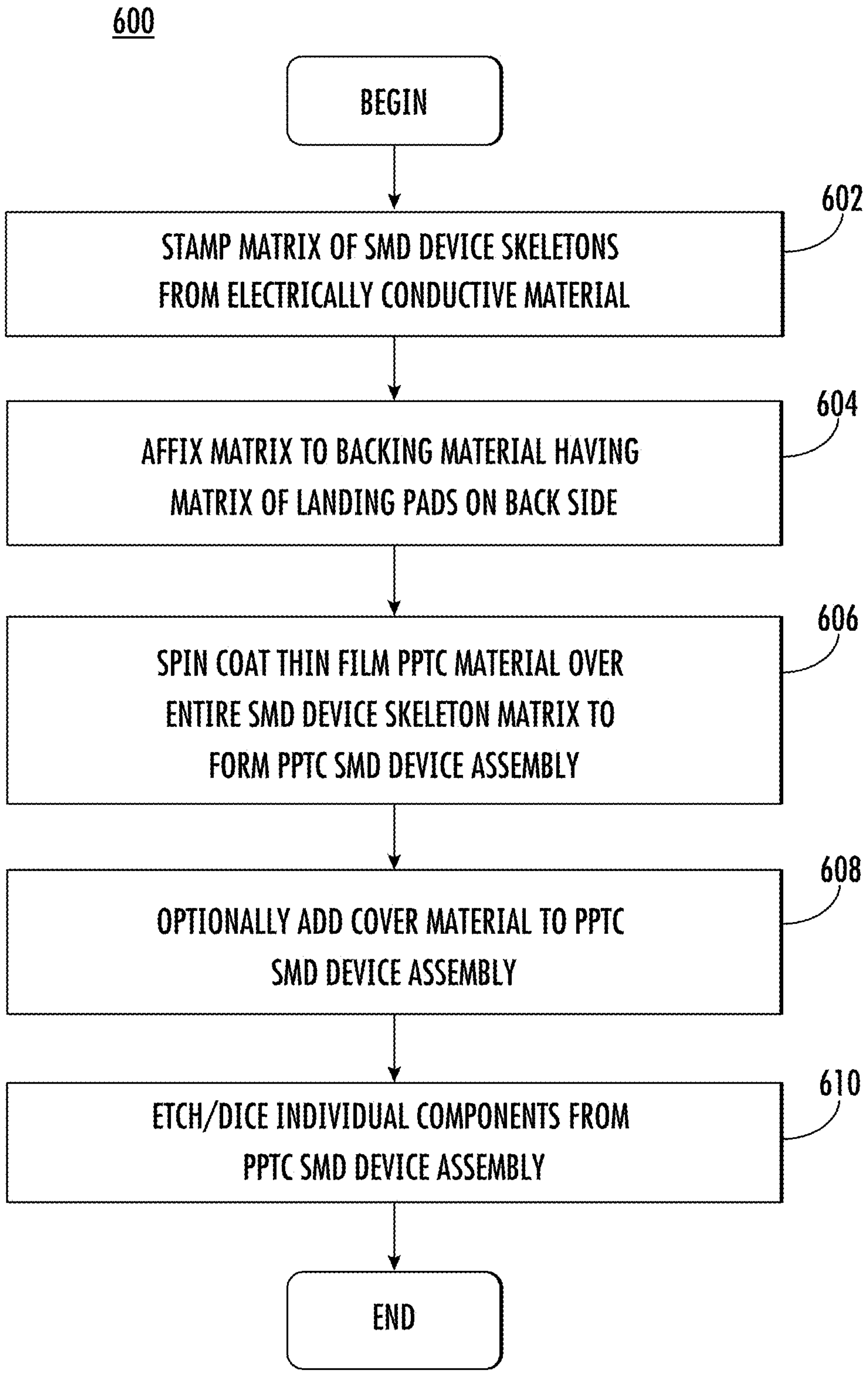
FIG. 6 is a flow diagram illustrating a method of manufacturing a PPTC SMD assembly, in accordance with exemplary embodiments.

FIG. 6 is a flow diagram of a method 600 of manufacturing a PPTC SMD assembly, such as the PPTC SMD assembly 400, according to exemplary embodiments. A matrix (e.g., FIG. 2A) of SMD skeletons (e.g., FIG. 1A) is stamped from an electrically conductive material, such as copper (block 602). The matrix is then affixed to a backing material having a matrix of landing pads on its back side, with each pair of landing pads to be associated with and lined up with respective pairs of terminals making up SMD skeletons (block 604). A thin film of PPTC material is then spin coated onto the SMD skeleton matrix, covering both the terminals and the whiskers of each SMD skeleton (block 606), including the PPTC material seeping into the vias of each pair of terminals and coming out the vias of respective landing pads.

Optionally, an additional cover material can be coated to the PPTC SMD assembly once the PPTC material has dried (block 608). The coating may be a polymer material, a ceramic, a plastic, and so on. The individual PPTC SMDs are then etched or diced as individual components from the PPTC SMD assembly (block 610). The method 600 thus makes available a batch process type of approach to build stand-alone PPTC devices or integrate a PPTC into existing wafer or singulated substrate-based products.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure is not limited to the described embodiments, but that it has the full scope defined by the language of the following claims, and equivalents thereof.

The invention claimed is:

1. A device assembly for surface mount devices (SMD), the device assembly comprising:
- a matrix comprising a plurality of rows, each row comprising a plurality of SMD skeletons, each SMD skeleton comprising:
  - a pair of terminals; and
  - a plurality of whiskers, the plurality of whiskers being disposed orthogonally between the pair of terminals;
  - a polymeric positive temperature coefficient (PPTC) material disposed over the matrix, wherein the PPTC material couples the terminals to the whiskers; and
  - comprising a backing upon which the matrix is disposed, the backing further comprising a pair of landing pads disposed opposite the pair of terminals such that the backing is sandwiched between the pair of landing pads and the pair of terminals.

2. The device assembly of claim 1, wherein the backing is a printed circuit board.

3. The device assembly of claim 1, wherein the backing is a flexible tape.

4. The device assembly of claim 1, wherein the pair of terminals comprises a first terminal with a first via and a second terminal with a second via.

5. The device assembly of claim 4, wherein the pair of landing pads comprises a first landing paid with a third via and a fourth landing pad with a fourth via.

6. The device assembly of claim 5, wherein the PPTC material oozes through the first via to the third via and oozes through the second via to the fourth via.

7. The device assembly of claim 5, wherein the PPTC material:
- couples the first terminal to the first landing pad; and
- couples the second terminal to the second landing pad.

8. The device assembly of claim 5, wherein the PPTC material:
- establishes an electrical connection between the first terminal and the first landing pad; and
- establishes an electrical connection between the second terminal and the second landing pad.

9. The device assembly of claim 1, wherein each SMD skeleton comprises an electrically conductive material.

10. The device assembly of claim 9, wherein the electrically conductive material comprises copper.

* * * * *